United States Patent
Matsui et al.

(10) Patent No.: US 8,605,422 B2
(45) Date of Patent: Dec. 10, 2013

(54) THIN DISPLAY APPARATUS

(75) Inventors: Yoshitaka Matsui, Osaka (JP);
Katsuhiko Matsuya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 218 days.

(21) Appl. No.: 13/127,504

(22) PCT Filed: Nov. 5, 2009

(86) PCT No.: PCT/JP2009/068870
§ 371 (c)(1),
(2), (4) Date: May 4, 2011

(87) PCT Pub. No.: WO2010/053107
PCT Pub. Date: May 14, 2010

(65) Prior Publication Data
US 2011/0211303 A1    Sep. 1, 2011

(30) Foreign Application Priority Data
Nov. 5, 2008  (JP) .................................. 2008-284789

(51) Int. Cl.
*G06F 1/16* (2006.01)
*G02F 1/1333* (2006.01)

(52) U.S. Cl.
USPC ............ 361/679.33; 361/679.21; 361/679.37; 349/58

(58) Field of Classification Search
USPC ............. 361/679.01–679.45, 679.55–679.59; 248/917–924; 211/26; 349/58–59
See application file for complete search history.

(56) References Cited

U.S. PATENT DOCUMENTS

| | | | |
|---|---|---|---|
| 6,532,152 B1 | 3/2003 | White et al. | |
| 7,466,541 B2* | 12/2008 | Takeda | 361/679.27 |
| 7,652,875 B2* | 1/2010 | Tsuchida | 361/679.21 |
| 7,845,608 B1* | 12/2010 | Chen et al. | 248/309.1 |
| 2003/0090867 A1* | 5/2003 | Olson et al. | 361/683 |
| 2006/0209228 A1* | 9/2006 | Nishida | 349/59 |
| 2007/0081109 A1* | 4/2007 | Igarashi | 349/58 |
| 2008/0100739 A1* | 5/2008 | Leung | 348/373 |
| 2008/0158802 A1 | 7/2008 | Tsuchida | |

FOREIGN PATENT DOCUMENTS

| | | | |
|---|---|---|---|
| EP | 0190646 A1 | 8/1986 | |
| JP | 2001-332074 A | 11/2001 | |
| JP | 2006-319908 A | 11/2006 | |
| JP | 2006319908 A | * 11/2006 | |
| JP | 2008-165883 A | 7/2008 | |
| JP | 2008-198246 A | 8/2008 | |
| KR | 10-2007-0121170 A | 12/2007 | |

OTHER PUBLICATIONS

European Search Report mailed Jan. 31, 2013 in European Patent Application No. 09824806.5.

* cited by examiner

*Primary Examiner* — Jayprakash N Gandhi
*Assistant Examiner* — Nidhi Desai
(74) *Attorney, Agent, or Firm* — Birch, Stewart, Kolasch & Birch, LLP

(57) ABSTRACT

A thin display apparatus equipped with a video display panel controls rise in temperature of a disk drive by heat-transfer from high temperature internals of the apparatus. A thermal insulating recess is formed in a face of a rear side casing which faces a disk drive unit, and a surface of the disk drive unit mounted on the rear side casing seals the thermal insulating recess. An area of the thermal insulating recess sealed by the disk drive unit becomes a thermal insulating layer between the rear side casing and the disk drive unit, and the thermal insulating layer interrupts thermal transfer from the high temperature internals of the apparatus to the disk drive unit.

6 Claims, 4 Drawing Sheets

THIN DISPLAY APPARATUS

This application is the national phase under 35 U.S.C. §371 of PCT International Application No. PCT/JP/2009/068870 which has an International filing date of Nov. 5, 2009 and designated the United States of America.

BACKGROUND

The present invention relates to a thin display apparatus comprising a video display panel and a disk drive unit mounted outside a rear side casing forming an exterior of a rear side of the video display panel.

DESCRIPTION OF RELATED ART

Nowadays, thickness reduction of a thin display apparatus as a panel-type display apparatus comprising a video display panel, such as a liquid crystal panel, has been increasingly advanced, as can be represented by a liquid crystal television receiver. Such a display apparatus generally has a thickness of several tens millimeters. Even one having a thickness of less than 10 millimeters begins to be introduced.

A thin display apparatus therefore generally has poor ventilation, with the component density therewithin enhanced by the thickness reduction. Accordingly, an internal temperature of a thin display apparatus may rise up to around 70 degrees C., and causing, in response, a temperature of a casing forming the exterior of the rear side to rise up to around 60 degrees C.

A recent thin display apparatus is equipped with a disk drive, such as an optical disk drive and a hard disk drive, and comprises a recording function for recording contents such as a broadcast program in a recording media such as an optical disk and a hard disk and a playback function based on recorded data. This realizes downsizing of a whole AV (Audio Visual) system having recording/playback functions. In addition, the optical disk drive includes a DVD (Digital versatile Disc) drive and a Blue-ray Disc drive, and the like.

A disk drive has a pickup unit for accessing the recording media, and the property of the pickup unit changes sensitively in accordance with the environmental temperature. A disk drive may therefore have a temperature for environmental resistance lower than those of other units in a thin display apparatus. Accordingly, countermeasures against heat are important for a disk drive mounted on a thin display apparatus.

For example, Japanese Patent Application Laid-Open No. 2001-332074 describes a liquid crystal television receiver having a disk drive unit mounted below a liquid crystal panel, wherein a thermal air current rises through a gap between the liquid crystal panel and a board provided on a rear side of the liquid crystal panel by the chimney effect.

SUMMARY

In a recent thin display apparatus, with its thickness reduction advanced, a disk drive is more often mounted outside a casing provided on the rear side of the liquid crystal panel, as compared with Japanese Patent Application Laid-Open No. 2001-332074 wherein a disk drive is arranged within a casing. This is for an improved appearance of a display apparatus achieved by hiding a disk drive on the rear side of the apparatus, and also for enabling the disk drive to be additionally mounted as an optional component.

However, in a particularly-thin display apparatus, mounting of a disk drive unit on a casing on the rear side whose temperature rises very high may result in an excessively high temperature of the disk drive unit itself.

Moreover, countermeasures against heat of a disk drive unit are preferred to be achieved by a structure as simple as possible. Furthermore, a disk drive unit is easily affected by dust, and it is therefore not preferable to employ an air cooling structure using the external air flowing in.

The present invention has been made on the basis of the above circumstances, and its object is to provide a thin display apparatus which controls rise in temperature of a disk drive by heat-transfer from high temperature internals of the apparatus by a simple configuration.

In order to achieve the above object, a thin display apparatus according to the present invention comprises a video display panel such as a liquid crystal panel and a disk drive unit mounted outside a rear side casing forming an exterior on a rear side of the video display panel.

In addition, in the thin display apparatus according to the present invention, a thermal insulating recess is formed in a face of the rear side casing opposite to the disk drive unit. The recess is formed as a thermal insulating recess if needed. Also advantageously, a surface of the disk drive unit mounted on the rear side casing seals the thermal insulating recess.

The sealed thermal insulating recess may be filled with, for example, air. Therefore, an assembling process of the apparatus does not need a process for filling the thermal insulating recess with a particular thermal insulator.

According to the present invention, an area of the thermal insulating recess sealed by the disk drive unit becomes a thermal insulating layer between the rear side casing and the disk drive unit, and the thermal insulating layer interrupts thermal transfer from the high temperature internals of the apparatus to the disk drive unit.

In addition, the disk drive unit also functions as a sealing member for the thermal insulating recess, and by only mounting the disk drive unit on the rear side casing, the thermal insulating layer is formed. The simple configuration realizes countermeasures against heat of the disk drive unit.

Moreover, unlike the air cooling structure using the external air flowing in, the thermal insulating layer is a sealed area cut off from the outside, and outside dust hardly enters into the disk drive unit.

When the disk drive unit is additionally mounted on the rear side of the thin display apparatus, a covering member surrounding the disk drive unit is generally provided for protection. Here, as an assembling process of a thin display apparatus, there may be two steps, that is, a first step of mounting the disk drive unit on the rear side casing, and a second step of mounting the covering member.

However, at the assembling site of the thin display apparatus, the disk drive unit is preferred to be mounted in a simpler process.

A thin display apparatus according to the present invention is therefore preferred to comprise a covering member in which the disk drive unit is mounted and also have the following configuration.

The covering member integrated with the disk drive unit is mounted on the rear side casing, so that the disk drive unit contacts a part around the thermal insulating recess and seals the same.

This enables, at the assembling site of the thin display apparatus, the disk drive unit to be mounted in a process of one step, in which the covering member integrated with the disk drive unit is only mounted on the rear side casing.

In addition, a thin display apparatus according to the present invention may have a structure in which a fitting recess is formed in the rear side casing to fit with the covering member, and the thermal insulating recess is formed inside the fitting recess.

This allows the covering member integrated with the disk drive unit to be fitted in the fitting recess and be positioned, and at the same time the disk drive unit to be positioned with respect to the thermal insulating recess. As a result, this facilitates the mounting of the disk drive unit and the covering member on the rear side casing. Additionally, a mechanism of fitting the covering member in the fitting recess makes it difficult for outside dust to enter into the disk drive unit.

According to the present invention, a thin display apparatus can control rise in temperature of a disk drive by heat-transfer from high temperature internals of the apparatus with a simple configuration.

The above and further objects and features will more fully be apparent from the following detailed description with accompanying drawings.

DETAILED DESCRIPTION

The present invention now will be described more fully hereinafter with reference to the accompanying drawings illustrating embodiments thereof. Additionally, the following embodiment is merely an embodied example of the present invention which should not limit the technical scope of the present invention.

Figure 1:
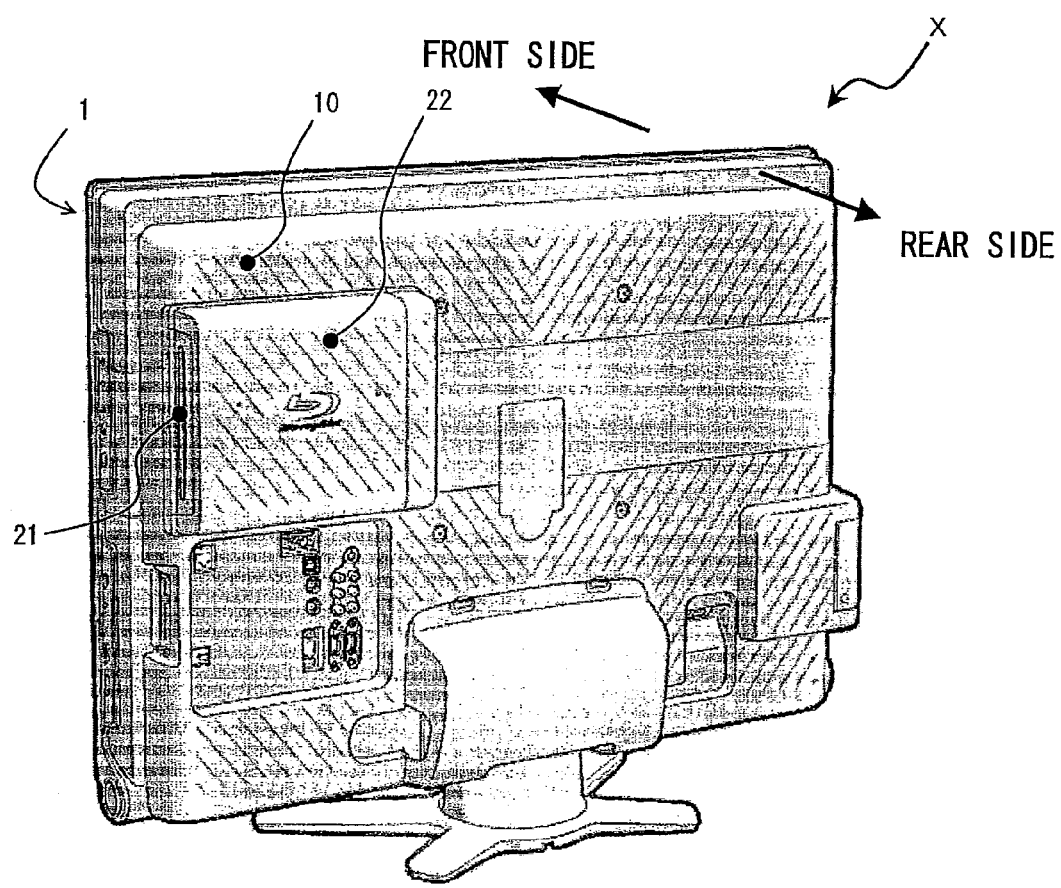
FIG. 1 is a perspective view viewed from a rear side of a liquid crystal television receiver X as an example of a thin display apparatus according to an embodiment of the present invention.
Figure 2:
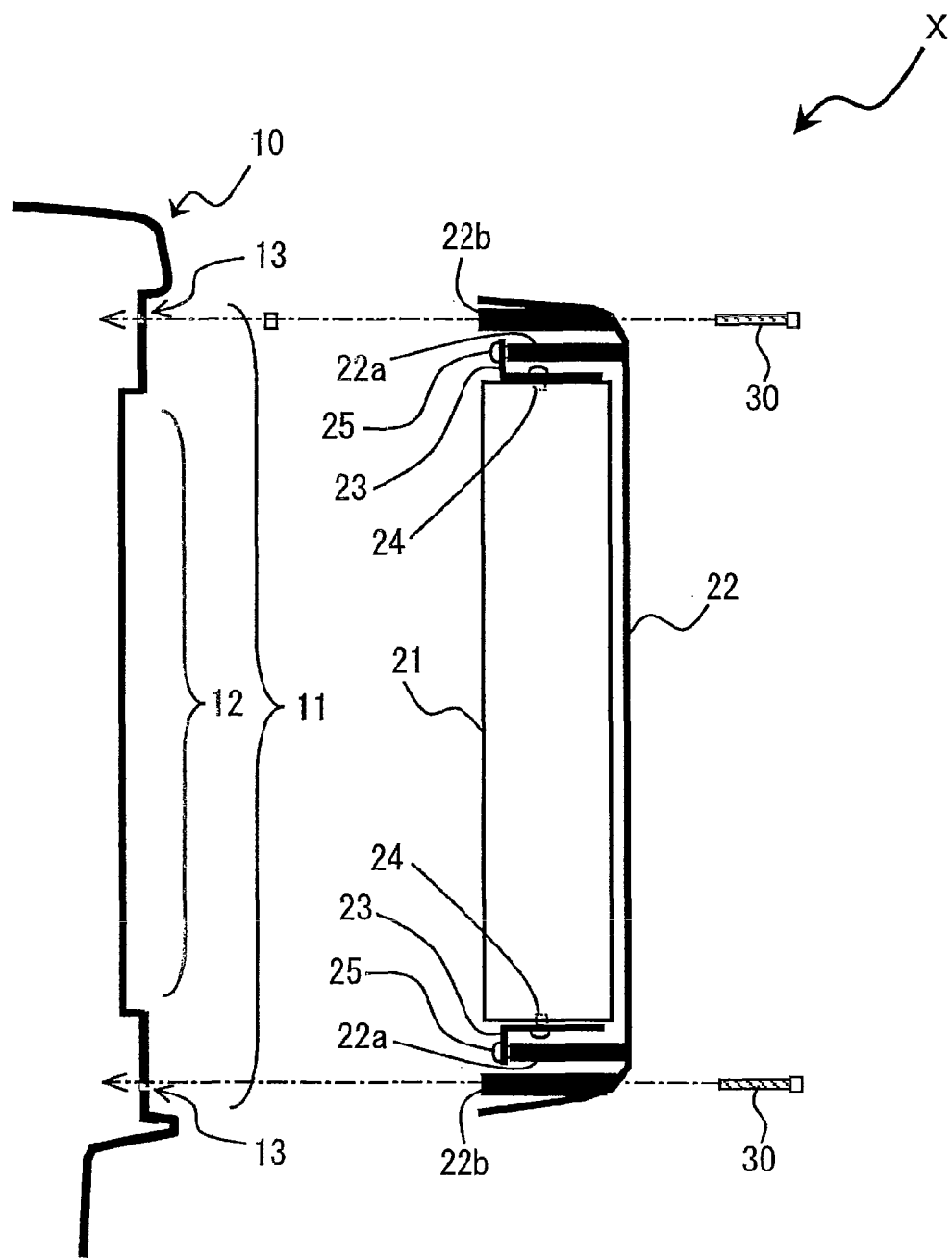
FIG. 2 is a cross sectional view showing an assembly structure of a disk drive in the liquid crystal television receiver X.
Figure 3:
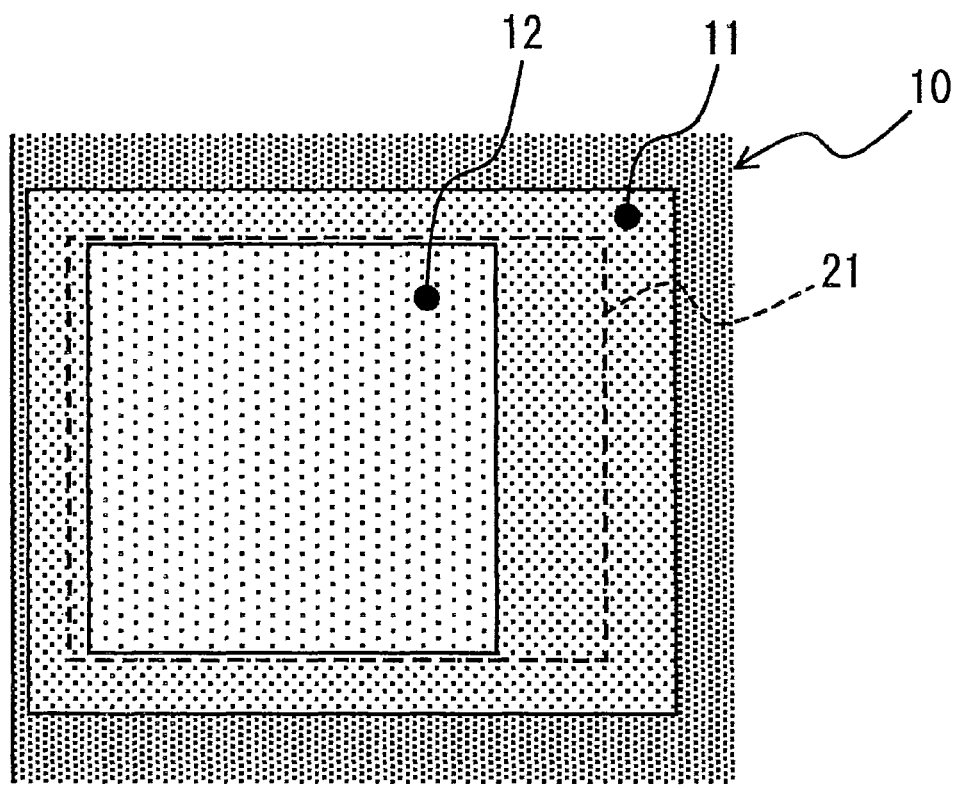
FIG. 3 is a view showing a position of a disk drive arranged on a rear side casing of the liquid crystal television receiver X.
Figure 4:
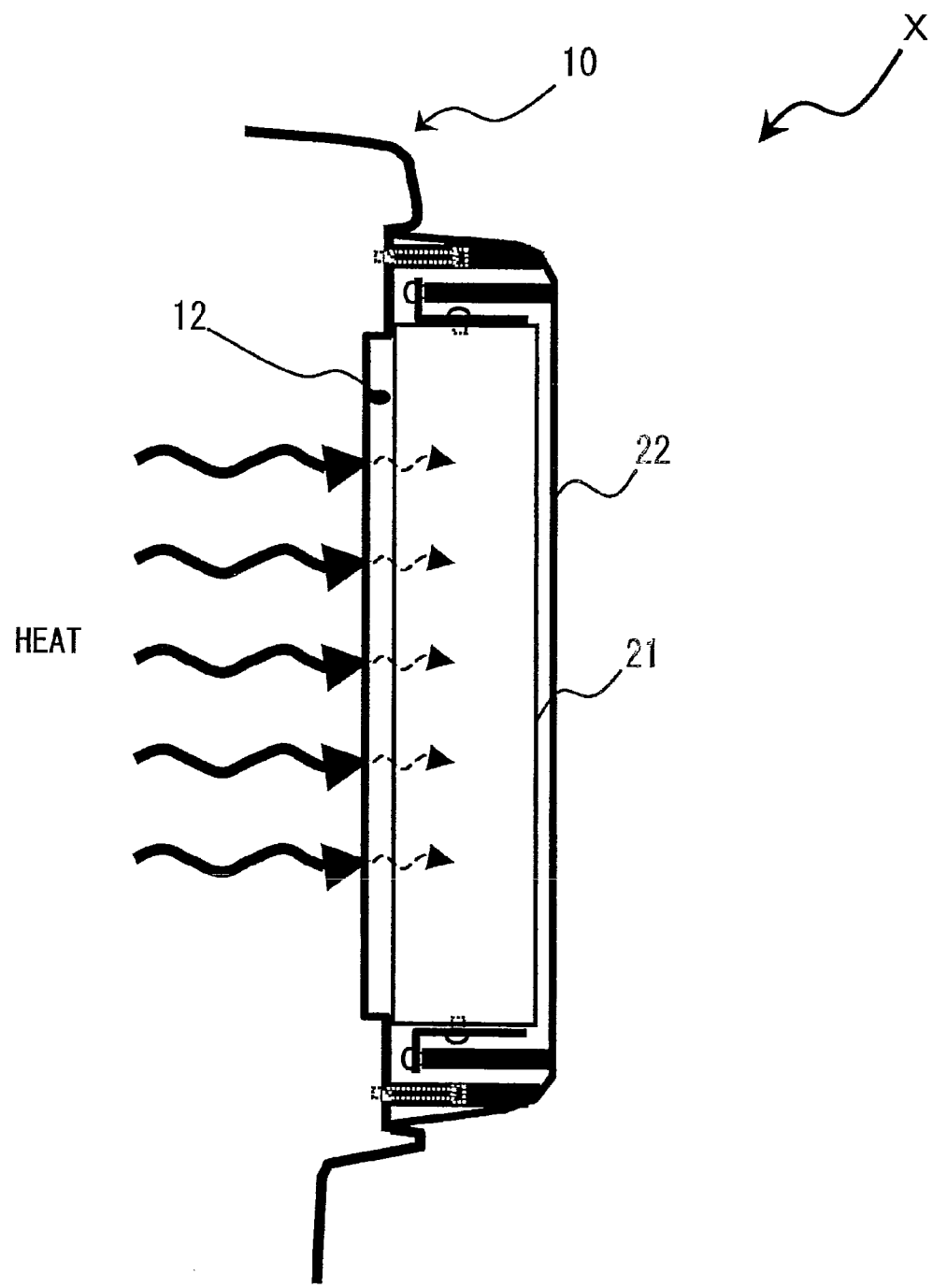
FIG. 4 is a cross sectional view showing a thermal insulation structure of a disk drive in the liquid crystal television receiver X.

FIG. 1 is a perspective view viewed from a rear side of a liquid crystal television receiver X as an example of a thin display apparatus according to an embodiment of the present invention; FIG. 2 is a cross sectional view showing an assembly structure of a disk drive in the liquid crystal television receiver X; FIG. 3 is a view showing a position of a disk drive arranged on a rear side casing of the liquid crystal television receiver X; FIG. 4 is a cross sectional view showing a thermal insulation structure of a disk drive in the liquid crystal television receiver X.

Referring now to a perspective view of FIG. 1, an appearance of a liquid crystal television receiver X as an example of a thin display apparatus according to an embodiment of the present invention is described.

The liquid crystal television receiver X comprises a liquid crystal panel 1 (display panel) for video display on a front side thereof, and a casing 10 forming an exterior on a rear side thereof. The casing 10 is hereinafter referred to as a rear side casing 10.

Moreover, the liquid crystal television receiver X comprises a disk drive unit 21 mounted outside the rear side casing 10, in other words, mounted on the rear side.

A covering member 22 is provided outside the disk drive unit 21 for covering the same.

The disk drive unit 21 is, for example, a Blue-ray disk drive and a DVD drive that is housed in and integrated with a box-shaped casing, and to/from which a disk as a data recording media is inserted/pulled from a side face of the liquid crystal television receiver X.

In the thin liquid crystal television receiver X, the rear side casing 10 is made of a member whose temperature is easy to rise high because heat generated from parts in the apparatus, such as a backlight for illuminating the liquid crystal panel 1 and an inverter circuit for supplying power to the backlight, is easily transferred to the member.

Next, the assembly structure of the disk drive unit 21 is described in reference to FIGS. 2 and 3.

The rear side casing 10 has a thermal insulating recess 12 (first recess) formed in a face opposite to the disk drive unit 21.

In the liquid crystal television receiver X, the disk drive unit 21 is mounted on the rear side casing 10, so that a surface of the disk drive unit 21 seals the thermal insulating recess 12.

The liquid crystal television receiver X comprises the covering member 22 in which the disk drive unit 21 is mounted. Here, the disk drive unit 21 is mounted in the covering member 22 by screws 24 and 25 through a mounting bracket 23. In other words, the disk drive unit 21 is mounted in the covering member 22 before being mounted on the rear side casing 10, so as to be integrated with the covering member 22. In an example shown in FIG. 2, the mounting bracket 23 is fixed to the disk drive unit 21 by the screw 24, while the mounting bracket 23 is fixed to a screw receiving part 22a as a part of the covering member 22 by the screw 25.

The covering member 22 integrated with the disk drive unit 21 is then mounted on the rear side casing 10 by a screw 30. In the example shown in FIG. 2, a thick part 22b having a through hole is formed in the covering member 22, and by the screw 30 inserted through the through hole of the thick part 22b, the covering member 22 is fixed to the rear side casing 10. Moreover, a screw hole 13 into which the screw 30 is screwed is formed in the rear side casing 10.

The covering member 22 is mounted on the rear side casing 10, so that the disk drive unit 21 contacts a part around the thermal insulating recess 12, in short, the part raised for one level than the thermal insulating recess 12 (after-mentioned fitting recess 11 and seals the thermal insulating recess 12.

FIG. 3 shows an example of an overlapping relationship between the thermal insulating recess 12 and the disk drive unit 21 viewed from the rear side of the apparatus.

In the example shown in FIG. 3, an area of the thermal insulating recess 12 covers approximately 76% of an area of a face of the disk drive unit 21 opposite to the rear side casing 10. In other words, only the rest of 24% of the area of the opposite face of the disk drive unit 21 contacts the part around the thermal insulating recess 12 in the rear side casing 10 (after-mentioned fitting recess 11.

As mentioned, the disk drive unit 21 can be mounted on the liquid crystal television receiver X by a process of only one step of mounting the covering member 22 integrated with the disk drive unit 21 on the rear side casing 10.

In addition, the sealed thermal insulating recess 12 is filled with, for example, air. It is therefore unnecessary to fill the thermal insulating recess 12 with a particular thermal insulator as an additional step in the assembly process of the liquid crystal television receiver X. The sealed thermal insulating recess 12 may be filled with a material having a thermal conductivity lower than air.

In the liquid crystal television receiver X, the area of the thermal insulating recess 12 sealed by the disk drive unit 21 becomes a thermal insulating layer between the rear side casing 10 and the disk drive unit 21. The thermal insulating layer drastically interrupts thermal transfer from the high temperature internals of the apparatus to the disk drive unit 21.

In addition, the disk drive unit 21 also functions as a sealing member for the thermal insulating recess 12, and by only mounting the disk drive unit 21 on the rear side casing 10, the thermal insulating layer is formed. Accordingly, as compared with a case where the rear side casing 10 has a double-layered structure including a thermal insulating layer or the like, the countermeasures against heat of the disk drive unit 21 can be achieved by a very simple structure.

Moreover, unlike the air cooling structure using the external air flowing in, the thermal insulating layer is a sealed area cut off from the outside, and outside dust hardly enters into the disk drive unit 21.

The rear side casing 10 is generally made of a resin, and its thermal transfer coefficient is around 1.5 [W/(m·K)]. On the other hand, with air filled in the sealed thermal insulating recess 12 as a thermal insulating layer, the thermal transfer coefficient of the thermal insulating layer is the same as the thermal transfer coefficient of air, i.e. around 0.02 [W/(m·K)]. Therefore, as compared with the area of the disk drive unit 21 in contact with the rear side casing 10, the area of the thermal insulating layer does not need to be concerned about the thermal transfer from the rear side casing 10 to the disk drive unit 21.

Here, the configuration of the present invention including the thermal insulating recess 12 is compared with a conventional configuration not including the thermal insulating recess 12. In the conventional configuration not including the thermal insulating recess 12, the entire face of the disk drive unit 21 opposite to the rear side casing 10 is in contact with the rear side casing 10.

With the assumption that a thermal resistance of the rear side casing 10 is Rcab, a thermal resistance of the disk drive unit 21 is Rdd, an internal temperature of the rear side casing 10, in other words, a temperature inside the apparatus is Tin, and an external temperature of the apparatus is Tout, a temperature Tdd1 of the disk drive unit 21 can be expressed in the following formula (1).

$$Tdd1=(Tin-Tout)\times[Rdd/(Rcab+Rdd)]+Tout \quad (1)$$

In the conventional configuration, it is generally assumed that Rcab:Rdd≈1:2. And so, when the internal temperature Tin of the apparatus is 75 degrees C., and the external temperature Tout of the apparatus is 35 degrees C., the temperature Tdd1 of the disk drive unit 21 in the conventional configuration is around 61 degrees C.

On the other hand, in the configuration of the present invention, an area of the thermal insulating recess 12 is assumed to cover approximately three fourth of an area of a face of the disk drive unit 21 opposite to the rear side casing 10. In short, an area of the opposite face of the disk drive unit 21 that is in contact with the rear side casing 10 is approximately one fourth of the entire opposite face. Here, in the configuration of the present invention, the thermal resistance Rcab of the rear side casing 10 that is in inverse proportion to the contact area is approximately four times of the thermal resistance in the conventional configuration. Therefore, in the configuration of the present invention, it can be generally assumed that Rcab:Rdd≈4:2. And so, when the internal temperature Tin of the apparatus is 75 degrees C. and the external temperature Tout of the apparatus is 35 degrees C., the configuration of the present invention can decrease the temperature Tdd1 of the disk drive unit 21 to around 48 degrees C.

Additionally, as shown in FIGS. 2 and 3, a fitting recess 11 (first recess) in which the covering member 22 is fitted is formed in the rear side casing 10. And the thermal insulating recess 12 is formed inside the fitting recess 11.

This allows the covering member 22 integrated with the disk drive unit 21 to be fitted in the fitting recess 11 and be positioned, and at the same time, the disk drive unit 21 to be positioned with respect to the thermal insulating recess 12. As a result, this facilitates the mounting of the disk drive unit 21 and the covering member 22 on the rear side casing 10. In addition, the mechanism of fitting the covering member 22 in the fitting recess 11 makes it difficult for outside dust to enter into the disk drive unit 21.

In the above embodiment, the covering member 22 integrated with the disk drive unit 21 is mounted on the rear side casing 10. However, other configurations may be employed. For example, the disk drive unit 21 may be first mounted on the rear side casing 10, and then the covering member 22 may be mounted on the same.

Moreover, the liquid crystal television receiver X may comprise an elastic member having a thermal insulating property, such as a rubber and an urethane, and being held between the face of the disk drive unit 21 opposite to the rear side casing 10 and a face of an outer edge of the thermal insulating recess 12 in the rear side casing 10. This can further increase the thermal resistance between the rear side casing 10 and the disk drive unit 21, and thereby enhancing the thermal insulating effect.

Industrial Applicability

The present invention allows the application to a thin display apparatus such as a liquid crystal television receiver.

The invention claimed is:

1. A display apparatus, comprising: a display panel; a casing being provided on a rear side of the display panel and constituting an exterior of the display apparatus; a disk drive unit mounted outside the casing, and a covering member in which the disk device unit is mounted, wherein a first recess is formed in a part of the casing opposite to the disk drive unit, and the covering member is mounted on the casing, so that the disk drive unit seals the first recess; wherein a second recess is formed in the casing to fit with the covering member, the first recess is formed inside the second recess, and the covering member is fitted in the second recess, so that the disk drive unit contacts the second recess to seal the first recess.

2. The display apparatus according to claim 1, wherein the first recess serves to thermal insulation.

3. The display apparatus according to claim 1, wherein the disk drive unit mounted on the casing seals the first recess.

4. The display apparatus according to claim 3, wherein the sealed first recess is filled with air.

5. The display apparatus according to claim 1, wherein the second recess is shallower than the first recess.

6. The display apparatus according to claim 1, wherein the first recess has an area which is approximately three fourth of an area where the disk drive unit faces the casing.

* * * * *